United States Patent
Lee et al.

(10) Patent No.: US 11,793,025 B2
(45) Date of Patent: Oct. 17, 2023

(54) DISPLAY DEVICE INCLUDING CAVITY AT BORDER PORTION

(71) Applicant: Samsung Display Co., LTD., Yongin-si (KR)

(72) Inventors: Jeong Seok Lee, Yongin-si (KR); Seung Wook Kwon, Hwaseong-si (KR); Jae Sik Kim, Hwaseong-si (KR); Woo Yong Sung, Seoul (KR); Seo Yeon Lee, Namyangju-si (KR); Ung-Soo Lee, Seoul (KR); Se Hoon Jeong, Suwon-si (KR); Seung Gun Chae, Hwaseong-si (KR); Seung-Yeon Chae, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 133 days.

(21) Appl. No.: 17/336,873

(22) Filed: Jun. 2, 2021

(65) Prior Publication Data
US 2022/0029129 A1    Jan. 27, 2022

(30) Foreign Application Priority Data
Jul. 21, 2020    (KR) .................. 10-2020-0090157

(51) Int. Cl.
*H01L 51/00*    (2006.01)
*H01L 51/52*    (2006.01)
(Continued)

(52) U.S. Cl.
CPC ...... *H01L 51/5253* (2013.01); *H01L 51/0097* (2013.01); *G02F 1/133331* (2021.01);
(Continued)

(58) Field of Classification Search
CPC ............. H01L 51/5253; H01L 51/0097; H01L 51/5281; H01L 51/529; H01L 51/5237; H01L 51/0096; H01L 51/5246; H01L 27/3276; H01L 27/3246; H01L 27/32; H01L 27/3272; H01L 27/3265; H01L 27/323; H01L 27/14678; H01L 2251/301; H01L 2251/5338; G02F 1/133331; G06F 1/1641; G06F 1/1652; G09F 9/301
See application file for complete search history.

(56) References Cited

U.S. PATENT DOCUMENTS 9,812,659 B2    11/2017  Kwon et al.
2019/0206968 A1*  7/2019  Yang .................. H01L 27/3276
(Continued)

FOREIGN PATENT DOCUMENTS

KR    10-2018-0089608    8/2018
KR    10-2019-0107214    9/2019
KR    10-2020-0002040    1/2020

*Primary Examiner* — Ida M Soward
(74) *Attorney, Agent, or Firm* — KILE PARK REED & HOUTTEMAN PLLC

(57) ABSTRACT

A display device includes a substrate and a protection film disposed on a rear side of the substrate. The substrate includes a first portion including a display area and having a first width, and a second portion extending from the first portion and having a second width narrower than the first width. The protection film includes a cavity at a border portion of the first portion and the second portion of the substrate.

20 Claims, 16 Drawing Sheets

US 11,793,025 B2

Page 2

(51) Int. Cl.
*H01L 27/14* (2006.01)
*H01L 27/32* (2006.01)
*G02F 1/13* (2006.01)
*G06F 1/16* (2006.01)
*G09F 9/30* (2006.01)
*H01L 27/146* (2006.01)
*G02F 1/1333* (2006.01)

(52) U.S. Cl.
CPC .......... *G06F 1/1641* (2013.01); *G06F 1/1652* (2013.01); *H01L 27/14678* (2013.01); *H01L 27/323* (2013.01); *H01L 27/3265* (2013.01); *H01L 27/3272* (2013.01); *H01L 27/3276* (2013.01); *H01L 51/529* (2013.01); *H01L 51/5281* (2013.01); *H01L 2251/301* (2013.01); *H01L 2251/5338* (2013.01)

(56) References Cited

U.S. PATENT DOCUMENTS

2019/0386089 A1* 12/2019 Hsu .................. H01L 27/3276
2020/0321429 A1* 10/2020 Yang ................. H01L 27/3276
2021/0209971 A1* 7/2021 Chu ..................... G06F 1/181

* cited by examiner

DISPLAY DEVICE INCLUDING CAVITY AT BORDER PORTION

CROSS-REFERENCE TO RELATED APPLICATION(S)

This application claims priority to and benefits of Korean Patent Application No. 10-2020-0090157 under 35 U.S.C. § 119, filed on Jul. 21, 2020 in the Korean Intellectual Property Office, the entire contents of which are incorporated herein by reference.

BACKGROUND

(a) Technical Field

This disclosure relates to a display device.

(b) Description of the Related Art

A display device such as an emissive display device may include a display panel on which a screen for displaying images may be positioned. The display panel may be manufactured by forming a plurality of layers and parts on a substrate.

Glass may be used as a substrate of the display panel. The glass substrate may be heavy and easily damaged, which are drawbacks, and the glass substrate may be rigid, so it may be difficult to transform or bend the display panel. Recently, flexible display panels using a flexible substrate which may be light, strong against impacts, and easily transformed or bent have been developed.

The display panel may include a bendable region. To bend the display panel, the display panel may be cut to have a predetermined shape, and the display panel may cause cracks at specific or various positions. In a case that the display panel is cracked, moisture may permeate into the display panel, and wires may be cut, so the cracks may cause defects in the display device.

The above information disclosed in this background section is only for enhancement of understanding of the background, and therefore it may contain information that does not form the prior art that may already be known to a person of ordinary skill in the art.

SUMMARY

Embodiments provide a display device including a display panel for reducing the generation and spreading of cracks.

A display device according to an embodiment may include a substrate and a protection film disposed on a rear side of the substrate. The substrate may include a first portion including a display area and having a first width; and a second portion extending from the first portion and having a second width narrower than the first width. The protection film may include a cavity at a border portion of the first portion and the second portion of the substrate.

An edge of the protection film and an edge of the substrate may define the cavity.

The cavity may be indented into the first portion of the substrate, the second portion of the substrate, or the first portion and the second portion of the substrate from the edge of the substrate.

The edge of the substrate defining the cavity may include a portion extending in a curved line.

The edge of the protection film defining the cavity may include a portion extending in a curved line.

The edge of the protection film may be inclined with respect to the cavity.

The second portion of the substrate may include a bending portion, and the cavity may be disposed between the display area and the bending portion.

The display device may further include an antireflection layer disposed on the first portion of the substrate, wherein the cavity may be disposed between the antireflection layer and the bending portion of the second portion of the substrate.

The display device may further include a plurality of wires disposed on the second portion of the substrate, wherein the cavity may be spaced apart from the plurality of wires and may not overlap the plurality of wires.

The first portion of the substrate may include two bendable regions disposed at respective sides of the substrate, and the second width of the second portion of the substrate may be equal to or less than a distance between the two bendable regions of the first portion of the substrate.

A display device according to an embodiment may include a display panel including a substrate; a protection film disposed on a side of the substrate. The display panel may include a main part including a display area; and an auxiliary part having a width less than a width of the main part. The auxiliary part may include an edge that may be adjacent to the main part forms a curved line, and the protection film may include a cavity indented from the edge of the auxiliary part.

An edge of the protection film and an edge of the display panel may define the cavity.

The edge of the protection film defining the cavity may include a portion extending in a curved line.

The edge of the protection film may be inclined with respect to the cavity.

The auxiliary part of the display panel may include a bending portion, and the cavity may be disposed between the display area and the bending portion.

The display panel may include an antireflection layer disposed in the main part and on the substrate, and the cavity may be disposed between the antireflection layer and the bending portion.

The display panel may include a plurality of wires disposed in the auxiliary part, and the cavity may be spaced apart from the plurality of wires and may not overlap the plurality of wires.

A display device according to an embodiment may include a cover panel; a protection film disposed on an upper side of the cover panel; a display panel disposed on an upper side of the protection film; and a window disposed on an upper side of the display panel. The display panel may include a first portion including a display area and having a first width; and a second portion extending from the first portion and having a second width narrower than the first width. The protection film may include a cavity at a border portion of the first portion and the second portion of the display panel, and the cavity may be positioned at an edge of the protection film and an edge of the display panel.

The second portion of the display panel may include a bending portion, and the cavity may be disposed between the display area and the bending portion.

The cover panel may include at least one of a shield layer, a heat radiation layer, and an impact absorbing layer.

According to an embodiment, the generation and propagation of cracks on the display panel, for example cracks in a substantially L-type shaped region, may be prevented or reduced, and hence, reliability of the display device may be further increased. Further, as the generation possibility of cracks is reduced, the bending portion may be bent with a lesser curvature radius, and the dead or empty space of the display device may be reduced.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
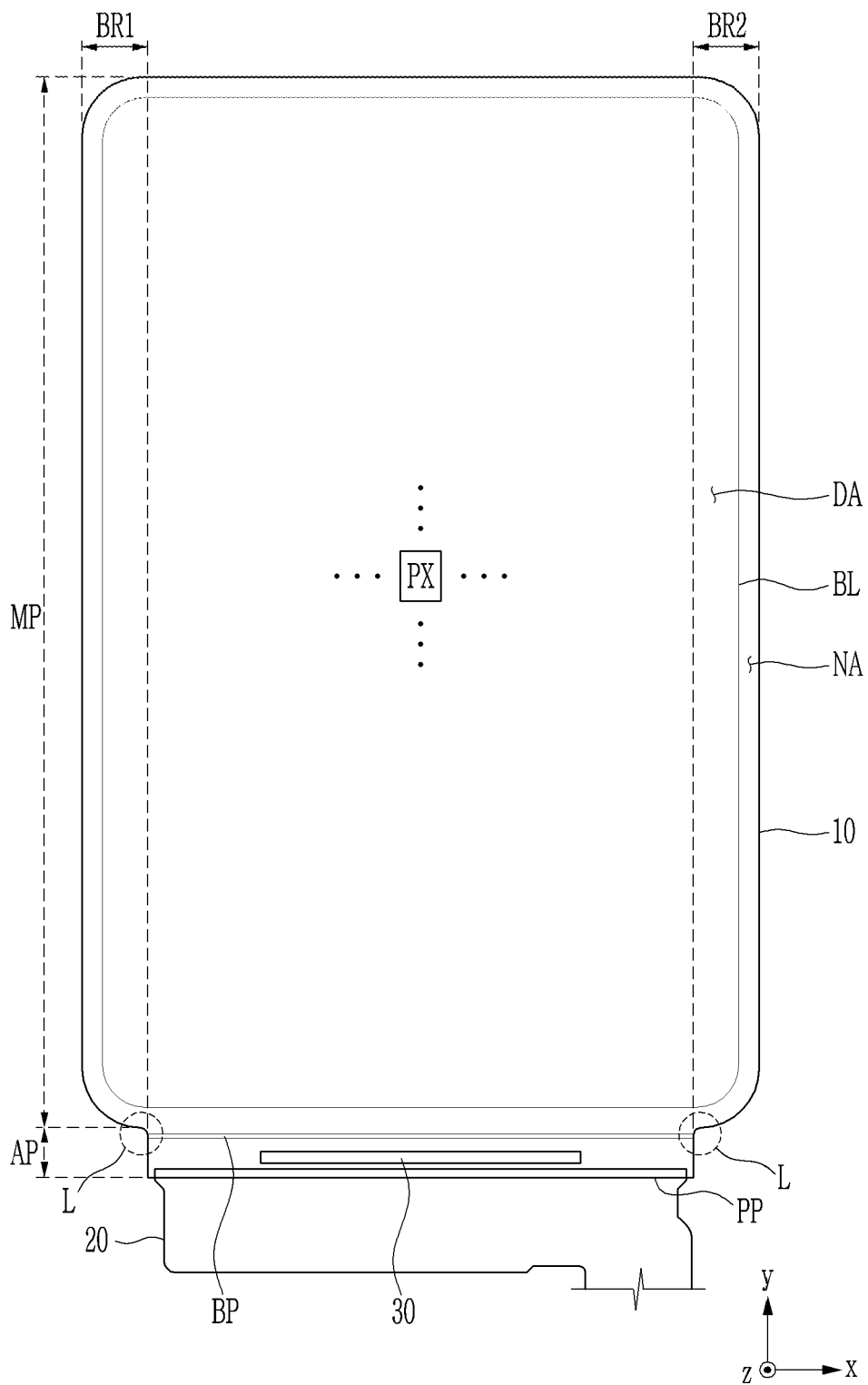
FIG. 1 shows a top plan view of a display device according to an embodiment.

In the following detailed description, embodiments have been shown and described by way of illustration.

The size and thickness of each component shown in the drawings may be arbitrarily illustrated or exaggerated for better understanding, clarity, and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the specification, unless explicitly described to the contrary, the word "comprise" and variations such as "comprises" or "comprising", "include" and variations such as "includes" or "including", "have" or "having" or "has" and other variations thereof, will be understood to imply the inclusion of stated elements, but not the exclusion of any other elements.

Throughout the specification, when it is described that a part is "connected (in contact with, coupled)" to another part, the part may be "directly connected" to the other element, may be "connected" to the other part through a third part, or may be "connected" to the other part physically or electrically, and they may be referred to by different titles depending on positions or functions, but respective portions that are substantially integrated into one body may be connected to each other.

In the drawings, a term x used to express a direction represents a first direction, a term y indicates a second direction that may be perpendicular to the first direction, and a term z denotes a third direction that may be perpendicular to the first direction and the second direction. The first direction (x), the second direction (y), and the third direction (z) may correspond to a horizontal direction, a vertical direction, and a thickness direction of the display device.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the disclosure and the scope of the appended claims. The terms of a singular form may include plural forms unless referred to the contrary.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by a person of ordinary skill in the art to which this disclosure pertains. Also, terms such as defined terms in commonly used dictionaries are to be interpreted as having meanings consistent with their meaning in the context of the relevant art and will not be interpreted in an ideal or excessively formal sense unless clearly defined in the specification.

FIG. 1 shows a top plan view of a display device according to an embodiment.

Referring to FIG. 1, the display device may include a driving unit including a display panel 10, a flexible printed circuit film 20 bonded to the display panel 10, and an integrated circuit chip 30.

The display panel 10 may include a display area (DA) that may correspond to a screen for displaying images, and a non-display area (NA) in which circuits and/or signal lines for generating and/or transmitting various signals that may be applied to the display area (DA) may be disposed. The non-display area (NA) may surround or may be adjacent to the display area (DA). In FIG. 1, an inside and an outside of a borderline (BL) may respectively correspond to the display area (DA) and the non-display area (NA).

Pixels PX may be disposed as a matrix in the display area (DA) of the display panel 10. The signal lines such as a scan line, a data line, a driving voltage line, and an initializing voltage line may be disposed in the display area (DA). The scan line may substantially extend in the first direction (x), and the data line and the driving voltage line may substantially extend in the second direction (y). The initializing voltage line may include a voltage line substantially extending in the first direction (x) and a voltage line substantially extending in the second direction (y), and may be disposed in a mesh form. A scan line, a data line, a driving voltage line, and an initializing voltage line may be electrically connected to each pixel PX, so that the pixel PX may receive a scan signal, a data signal, a driving voltage, and an initializing voltage from the signal lines. Each pixel PX may also receive a common voltage. The pixel PX may be realized with a light emitting element such as a light emitting diode (LED).

A touch sensor for sensing a contact and/or non-contact touch of a user may be disposed in the display area (DA).

A pad portion (PP) on which pads for receiving signals from an outside of the display panel 10 may be arranged or disposed may be positioned or disposed in the non-display area (NA) of the display panel 10. The pad portion (PP) may be positioned or disposed in the first direction (x) along an edge of the display panel 10. The flexible printed circuit film 20 may be bonded to the pad portion (PP), and the pads of the flexible printed circuit film 20 may be electrically connected to the pads of the pad portion (PP).

A driving unit for generating and/or processing various signals for driving the display panel 10 may be positioned or disposed in the non-display area (NA) of the display panel 10. The driving unit may include a data driver for applying data signals to data lines, a scan driver for applying scan signals to scan lines, and a signal controller for controlling the data driver and the scan driver. The pixels PX may receive a data signal at a predetermined time according to the scan signal generated by the scan driver. The scan driver may be integrated with the display panel 10, and may be positioned or disposed on at least one or a side of the display area (DA). The data driver and the signal controller may be provided as an integrated circuit chip (also referred to as a driving IC chip) 30, and the integrated circuit chip 30 may be mounted in the non-display area (NA) of the display panel 10. The integrated circuit chip 30 may be mounted on the flexible printed circuit film 20 and may be electrically connected to the display panel 10.

In the viewpoint of shapes, the display panel 10 may include a main part (MP) and an auxiliary part (AP).

The main part (MP) may represent a portion where the display area (DA) may be generally positioned or disposed, and may include the non-display area (NA) surrounding or being adjacent to the display area (DA). For example, the main part (MP) may mostly be the display area (DA), and an edge portion may be the non-display area (NA). The main part (MP) may be referred to as a display unit. The main part (MP) may be substantially quadrangular (with substantially round edges). The main part (MP) may have various other shapes such as substantially a circle in addition to the quadrangle.

The auxiliary part (AP) may represent a portion extending from one or an end of the main part (MP), and may correspond to the non-display area (NA). A pad portion (PP) may be positioned or disposed on an edge portion of the auxiliary part (AP) that may be distant from the main part (MP). A bending portion (BP) may be positioned or disposed on the auxiliary part (AP), and an integrated circuit chip 30 may be mounted between the pad portion (PP) and the bending portion (BP). The auxiliary part (AP) may be referred to as a connector.

The substrate (SB) may include a first portion corresponding to the main part (MP) and a second portion corresponding to the auxiliary part (AP), and the width of the second portion of the substrate (SB) may be less than the width of the first portion of the substrate (SB). The second portion of the substrate (SB) may extend from the first portion of the substrate (SB), and the first portion and the second portion of the substrate (SB) may be integrally formed or integral with each other.

Respective edge areas of the display panel 10 in the first direction (x) may be bendable regions BR1 and BR2. The pixels PX may be disposed in the bendable regions BR1 and BR2. In a case that the bendable regions BR1 and BR2 of the display panel 10 may be bent with a predetermined curvature radius, and the display device may be seen from the front, the non-display area (NA) may be scarcely perceptible. Therefore, in a case that the display device may be viewed from the front, the screen may occupy most of the visible region, and a screen-to-body ratio of the display device may be increased.

The bendable regions BR1 and BR2 on the respective sides of the display panel 10 may be positioned or disposed on the main part (MP). To bend the bendable regions BR1 and BR2, the auxiliary part (AP) may have a narrower width than the main part (MP) in the first direction (x). The width of the auxiliary part (AP) may be equal to or less than a distance between the bendable region BR1 and the bendable region BR2. By the narrow auxiliary part (AP), the display panel 10 may have a shape obtained by cutting corners at respective sides at the bottom of the substantial rectangle as an L type. The L type may be formed by the bottom edge of the main part (MP) and the side edge of the auxiliary part (AP).

The bending portion (BP) may be positioned or disposed to cross or intersect the display panel 10 in the first direction (x). The display panel 10 may be bent with a predetermined curvature radius on the bending portion (BP) with respect to the bending axis in parallel to the first direction (x). In a case that the display panel 10 may be a top emission type, the pad portion (PP) and the flexible printed circuit film 20 that may be farther from the main part (MP) than the bending portion (BP) may be bent so that they may be positioned or disposed on a rear side of the main part (MP). In a case that the bending portion (BP) is bent, the integrated circuit chip 30 may also be positioned or disposed on the rear side of the main part (MP). Regarding the electronic device to which the display device may be applied, the display panel 10 may be bent as described above. While the bending portion (BP) is bent, a substantially planar shape of the display panel 10 may substantially correspond to the substantially planar shape of the main part (MP). The bending portion (BP) may be bent with respect to one or a bending axis, or may be bent with respect to a plurality of bending axes.

Figure 2:
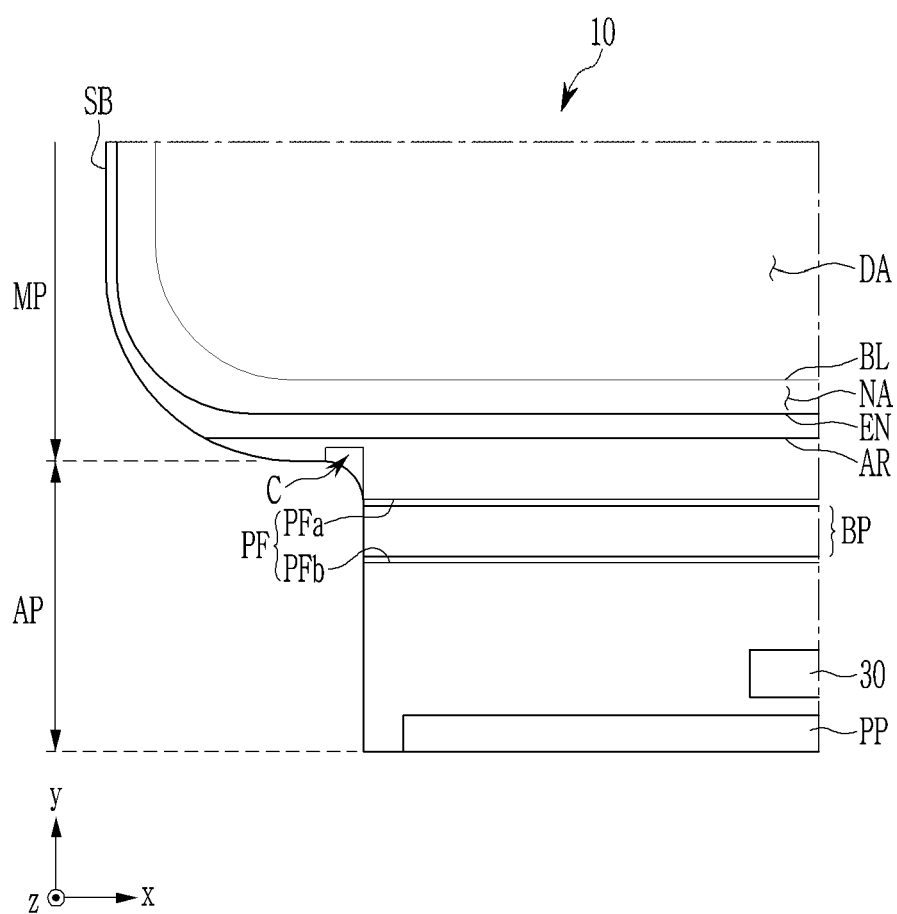
FIG. 2 shows a partial enlarged view of a display panel in a display device described with reference to FIG. 1.
Figure 3:
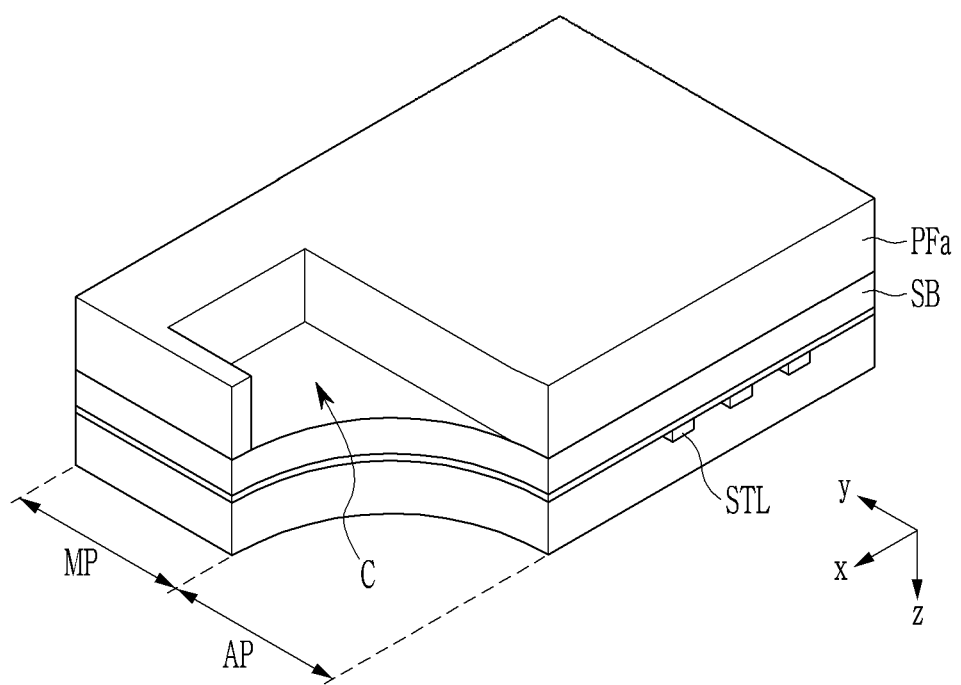
FIG. 3 shows a partial perspective view of a display panel in a display device described with reference to FIG. 1.

FIG. 2 shows a partial enlarged view of a display panel in a display device described with reference to FIG. 1, and FIG. 3 shows a partial perspective view of a display panel in a display device described with reference to FIG. 1.

FIG. 2 shows a bottom left portion of a display panel 10 according to an embodiment. FIG. 2 shows several layers or elements that may be differently positioned or disposed in the display area (DA) and the non-display area (NA). FIG. 3 shows a peripheral area of a cavity (C) of a protection film (PFa) on a display panel 10 according to an embodiment. Cavity (C) of a protection film (PFa) may also be referred to as an aperture.

Referring to FIG. 2 and FIG. 3, the display panel 10 may include a substrate (SB) that may serve as a base when the display panel 10 is manufactured. An encapsulation layer (EN) and an antireflection layer (AR) may be positioned or disposed on the substrate (SB). A protection film (PF) may be positioned or disposed below the substrate (SB). The substrate (SB) may be continuously positioned or disposed on the main part (MP) and the auxiliary part (AP). The substrate (SB) may conform to the general substantially planar shape of the display panel 10. An edge of the substrate (SB) may match an edge of the display panel 10, and unless specifically described, characteristics and descriptions on the edge of the display panel 10 may be applied to the edge of the substrate (SB).

The encapsulation layer (EN) may encapsulate the light-emitting devices positioned or disposed in the display area (DA) to prevent permeation of moisture or oxygen. The encapsulation layer (EN) may be a thin film encapsulation layer including at least one inorganic layer and at least one organic layer. The antireflection layer (AR) may be attached to or coated on the encapsulation layer (EN) so as to reduce reflection of external light. The antireflection layer (AR) may include a polarizer or a polarization layer. The encapsulation layer (EN) and the antireflection layer (AR) may cover or overlap the display area (DA), and an edge of the encapsulation layer (EN) may be positioned or disposed in the non-display area (NA) of the main part (MP). An edge of the antireflection layer (AR) may correspond to the edge of the main part (MP) or may be positioned or disposed in the non-display area (NA) of the main part (MP). The encapsulation layer (EN) and the antireflection layer (AR) may not be positioned or disposed in the auxiliary part (AP).

The protection film (PF) may cover or overlap the rear side of the substrate (SB) to protect the substrate (SB) from physical contacts. The protection film (PF) may be positioned or disposed on the rear side of the substrate (SB), but may not be positioned or disposed on the bending portion (BP) so as to reduce a bending stress and a curvature radius of the bending portion (BP). The protection film (PF) may be separated into two portions by the bending portion (BP), that is, a protection film (PFa) and a protection film (PFb). The protection film (PFa) may be positioned or disposed on the main part (MP) and the auxiliary part (AP), and the protection film (PFb) may be positioned or disposed on the auxiliary part (AP). The protection film (PF) may be formed by coating a resin and curing the resin through an inkjet process. The protection film (PF) may be provided by attaching a film to the protection film (PF).

While the display panel 10 is processed, the auxiliary part (AP) on which the antireflection layer (AR) may not be positioned or disposed may be relatively thin and narrow, so that the auxiliary part (AP) may be easily bent. In a case that the auxiliary part (AP) is physically transformed such as being bent, a peripheral area of the substantially L-shaped edge that may be a border portion (corresponding to the border portion of the first portion and the second portion of the substrate (SB)) of the main part (MP) and the auxiliary part (AP) may be deflected or distorted on the display panel 10, so a stress may be focused on the corresponding region (hereinafter, a substantially L-shaped region or a border portion). The substantially L-shaped region may be a point where the edge of the auxiliary part (AP) meets the edge of the main part (MP), and a peripheral region thereof. The edge of the auxiliary part (AP) positioned or disposed adjacent to the main part (MP) may form a substantially curved line.

The substantially L-shaped region may represent a region in which a proceeding direction of laser beams may change while the display panel 10 may be cut in a predetermined shape that may be shown by use of the laser beams, so a lot of laser energy may be applied. By this, the protection film (PF) may be carbonized or indurated in the substantially L-shaped region, and the possibility that the cracks generate and propagate may be increased in the inorganic insulating layer. Further, the stress may be changed (for example, increased) according to a transformation (for example, expansion) of the protection film (PF) or a change of physical properties (for example, modulus, heat expansion coefficient, and moisture absorbing coefficient) in the high temperature and high moisture condition, so the inorganic insulating layer may be cracked. The cracks generated in the substantially L-shaped region may be spread to a wire such as a signal transmitting line (STL) to break the wire, and moisture may permeate through the cracks or through a gap between the layers peeled off by the cracks.

To prevent or reduce the generation and propagation of cracks in the substantially L-shaped region, the protection film (PF) may include a cavity (C) in the substantially L-shaped region on which the stress may be focused. The cavity (C) may signify that the protection film (PF) may not be locally formed or positioned or disposed. The cavity (C) may have a shape indented into the main part (MP) and/or the auxiliary part (AP) from the edge of the substantially L-shaped region. The edge of the display panel 10 and the edge of the protection film (PF) may define the cavity (C) in the substantially L-shaped region. The edge of the display panel 10 corresponds to the edge of the substrate (SB), so the cavity (C) may be defined by the edge of the substrate (SB) and the edge of the protection film (PF).

The edge of the display panel 10 may include a portion that extends as a curved line in the substantially L-shaped region, and the portion extending as a curved line may generally be an edge of the auxiliary part (AP). At least part of the curved edge of the display panel 10 may define the cavity (C) in the substantially L-shaped region. In other words, the cavity (C) may have a shape being opened to the substantially curved edge of the display panel 10. In a case that the cavity (C) is positioned or disposed in the substantially L-shaped region, an influence according to the transformation of the protection film (PF) or the change of physical properties in the corresponding region is reduced, thereby preventing or reducing the generation and propagation of cracks. The rear side of the substrate (SB) in which the cavity (C) is positioned or disposed may be exposed.

Figure 4:
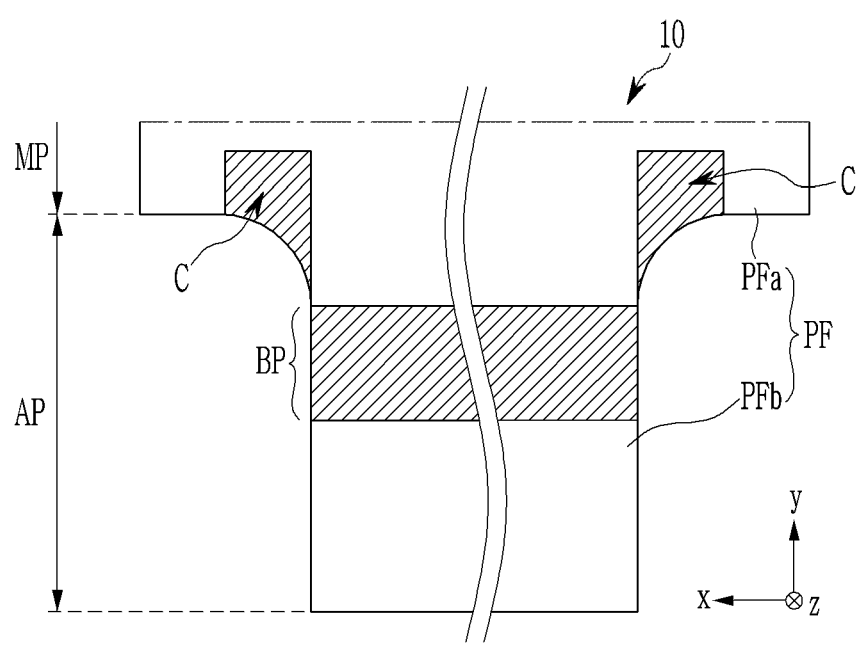
FIG. 4 shows a position of a protection film in a display device described with reference to FIG. 1.

FIG. 4 shows a position of a protection film in a display device described with reference to FIG. 1.

Referring to FIG. 4, the display panel 10 includes a region shown in hatching that may represent a region in which the protection film (PF) may not be disposed. The substrate (SB) of the display panel 10 may not be covered or overlapped by the protection film (PF) but may be exposed in the region shown in hatching. As described above, the protection film (PF) may not be positioned or disposed on the bending portion (BP) of the display panel 10 so as to reduce the bending stress and the curvature radius. Further, the protection film (PF) may not be positioned or disposed in the cavity (C). The protection film (PF) may be positioned or disposed in a remaining region of the display panel 10 excluding the bending portion (BP) and the cavity (C).

A wire disposal near a cavity (C) in the display panel 10 and a cross-section thereof will now be described with reference to FIG. 5 and FIG. 6.

Figure 5:
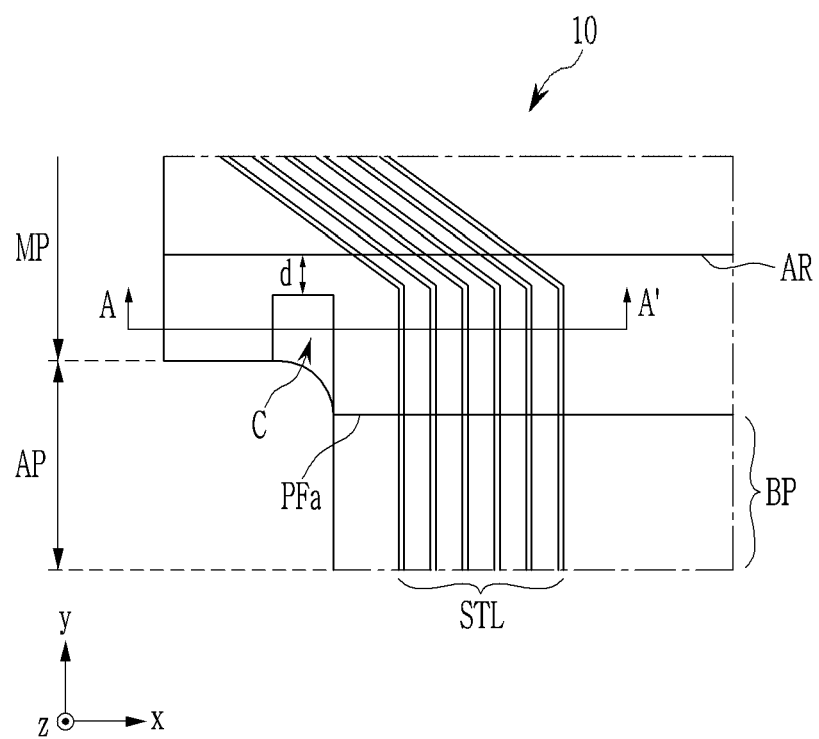
FIG. 5 shows a partial enlarged view of a display panel in a display device according to an embodiment.
Figure 6:
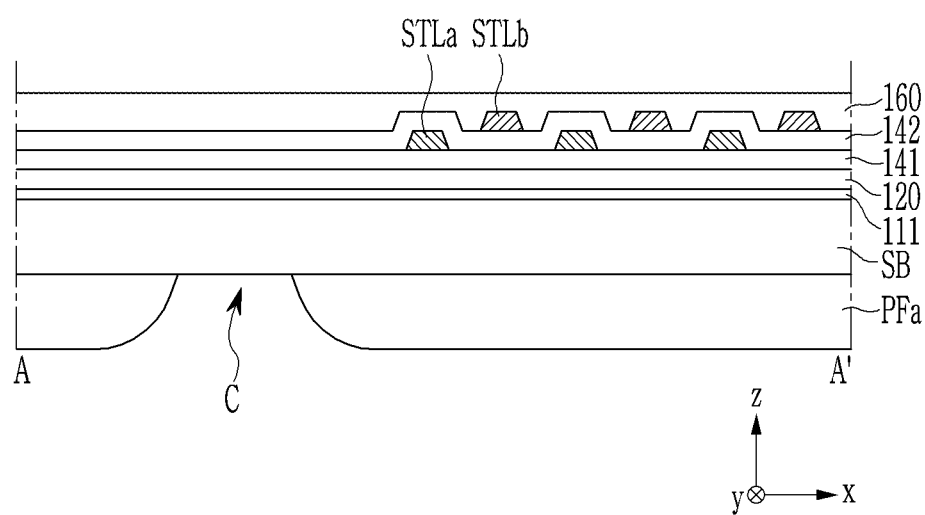
FIG. 6 shows a schematic cross-sectional view with respect to line A-N of FIG. 5 according to an embodiment.
Figure 7:
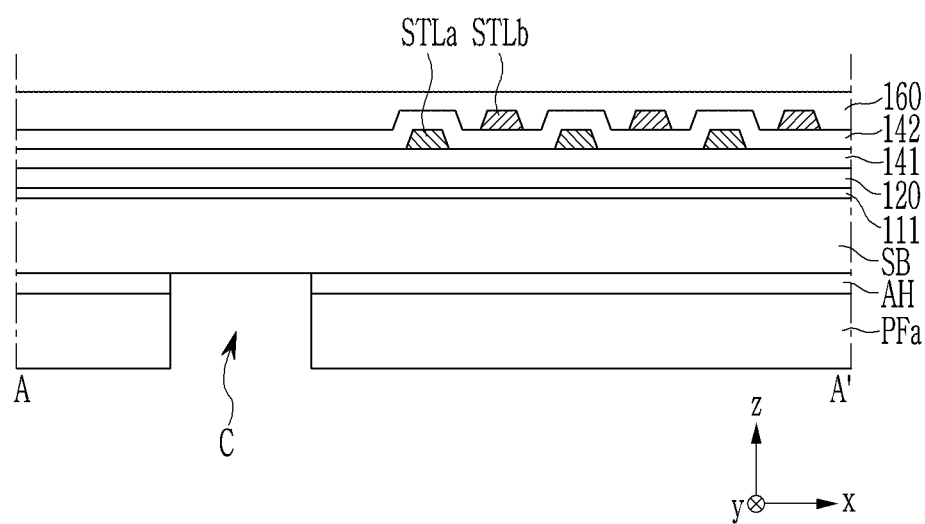
FIG. 7 shows a schematic cross-sectional view with respect to line A-N of FIG. 6 according to an embodiment.

FIG. 5 shows a partial enlarged view of a display panel in a display device according to an embodiment, and FIG. 6 and FIG. 7 show schematic cross-sectional views with respect to line A-N of FIG. 5 according to an embodiment.

Referring to FIG. 5 and FIG. 6, the display panel 10 may have a configuration in which insulating layers and conductive layers may be stacked on a substrate (SB).

The substrate (SB) may be a flexible substrate including a polymer layer made of a polyimide, a polyamide, or the like within the spirit and the scope of the disclosure. The substrate (SB) may, for example, have a multi-layered configuration including two polymer layers and a barrier layer therebetween.

A barrier layer 111 may be positioned or disposed on the substrate (SB), and a buffer layer 120 may be positioned or disposed on the barrier layer 111. The barrier layer 111 may prevent moisture or oxygen from permeating into the display panel 10. The buffer layer 120 may block impurities that may spread to the semiconductor layer from the substrate (SB), and may reduce the stress applied to the substrate (SB) for a process for forming the semiconductor layer. The barrier layer 111 and the buffer layer 120 may be inorganic insulating layers including inorganic insulating materials such as a silicon oxide (SiOx) and a silicon nitride (SiNx).

A first gate insulating layer 141 may be positioned or disposed on the buffer layer 120, and signal transmitting lines (STLa) may be positioned or disposed on the first gate insulating layer 141. A second gate insulating layer 142 may be positioned or disposed on the signal transmitting lines (STLa), and signal transmitting lines (STLb) may be positioned or disposed on the second gate insulating layer 142. An interlayer insulating layer 160 may be positioned or disposed on the signal transmitting lines (STLb). The first gate insulating layer 141, the second gate insulating layer 142, and the interlayer insulating layer 160 may be inorganic insulating layers including inorganic insulating materials such as a silicon oxide and a silicon nitride.

By disposing the signal transmitting lines (STLa and STLb) on two layers, more of the signal transmitting lines (STLa and STLb) with a predetermined width may be disposed in a limited region. The signal line transmitting lines (STLa and STLb) positioned or disposed near the substantially L-shaped region may, for example, transmit a common voltage, a low gate voltage, an initializing voltage, a high gate voltage, and a test signal. The signal transmitting lines (STLa and STLb) may be positioned or disposed on another layer that may be different from the illustrated layer or layers, for example, between the barrier layer 111 and the buffer layer 120, between the buffer layer 120 and the first gate insulating layer 141, or on the interlayer insulating layer 160.

A protection film (PFa) may be positioned or disposed below the substrate (SB). The protection film (PFa) may include a cavity (C) positioned or disposed in the substantially L-shaped region. The barrier layer 111, the buffer layer 120, the first gate insulating layer 141, the second gate insulating layer 142, and/or the interlayer insulating layer 160 that may be inorganic insulating layers may be cracked by the stress that may be focused or applied on the substantially L-shaped region. In a case that the cracks reach the signal transmitting lines (STLa and STLb), the signal transmitting lines (STLa and STLb) may be cracked to break the lines. However, a transformation or bending may be suppressed in the substantially L-shaped region by the cavity (C) to reduce the stress, and the generation of cracks may be prevented or reduced.

The protection film (PFa) may be formed by coating a resin on the rear side of the substrate (SB). For example, the protection film (PFa) may be formed by coating a UV curable resin on the rear side of the substrate (SB) according to an inkjet process, irradiating UV rays, and curing them. An acryl-based resin, a urethane-based resin, and an epoxy-based resin may be used as the UV curable resin. For example, the UV curable resin may include at least one of polyester acrylate, epoxy acrylate, urethane acrylate, polyether acrylate, silicon acrylate, alicyclic epoxy resin, glycidyl ether epoxy resin, and epoxy acrylate.

The resin may be coated with various patterns by use of the inkjet process. The cavity (C) may be formed by not coating the resin in the corresponding region in a case that the protection film (PFa) is formed. The cracks that may be generated or spread in the substantially L-shaped region may be effectively blocked by the cavity (C). The resin flows before it is cured, after it is coated, so the edge of the protection film (PFa) for defining the cavity (C) may have a gentle or slight slope. In other words, the edge of the protection film (PFa) may be inclined with respect to the cavity (C).

The protection film (PFa) may be formed to have various characteristics or functions in addition to the function of protecting the substrate (SB). For example, in a case that the display panel 10 may be applied to a foldable display device, the protection film (PFa) may be formed to have a low modulus and a slim thickness. In a case that the display panel 10 may include a light transmitting region, the protection film (PFa) may be formed to transmit or block beams with a specific or predetermined wavelength. The protection film (PFa) may be made of a material with high heat conductivity to have a heat radiation function. The multifunctional protection film (PFa) may replace a cover panel to be described. The protection film (PFa) may be a single layer or a multilayer.

Referring to FIG. 7, the protection film (PFa) may be attached to the rear side of the substrate (SB) by an adhesive (AH). The cavity (C) may be formed by cutting the protection film (PFa) by use of laser beams after attaching the protection film (PFa). Differing from this, the protection film (PFa) in which the cavity (C) may be formed may be attached to the rear side of the substrate (SB).

Figure 8:
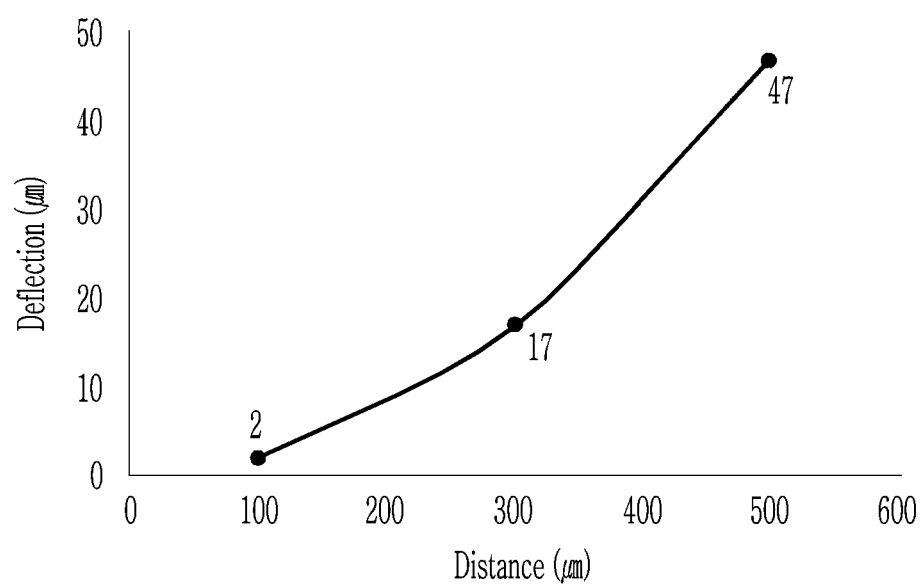
FIG. 8 shows a graph of a deflection relationship of a display panel with respect to a distance between a cavity and an antireflection layer in a display panel according to an embodiment.

FIG. 8 shows a graph of a deflection relationship of a display panel with respect to a distance between a cavity and an antireflection layer in a display panel according to an embodiment.

Referring to FIG. 5 and FIG. 8, the protection film (PFa) may be made by a coating process, and a deflection degree of the auxiliary part (AP) of the display panel 10 is simulated in a high temperature/high humidity condition (85° C./85%). The protection film (PFa) may have a thickness of about 50 μm, a modulus of about 0.06 GPa, a heat expansion coefficient of about 150 ppm/° C., and a moisture absorbing expansion coefficient of about 20 pmm/%. As shown in the graph given in FIG. 8, it is apparent that, as a distance (d) between the cavity (C) and the antireflection layer (AR) reduces, the deflection of the display panel 10 is reduced. This signifies that the deflection of the display panel 10 caused by the protection film (PFa) may be significantly reduced by the cavity (C) in the high temperature/high humidity condition.

Figure 9:
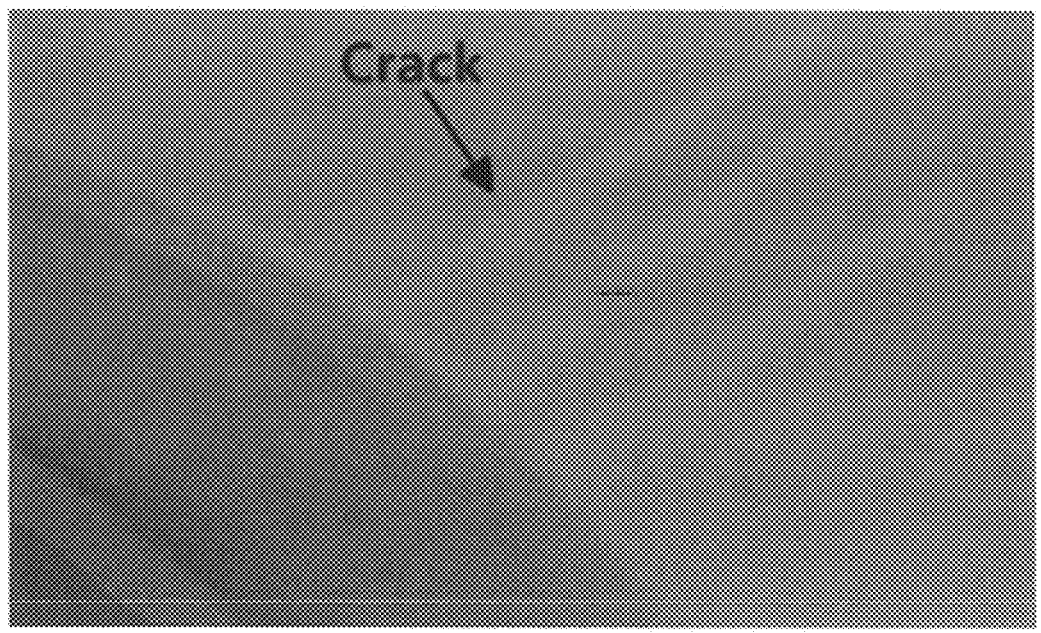
FIG. 9 shows a photograph of an unbiased highly accelerated stress test (UHAST) result of a display panel according to a comparative example.
Figure 10:
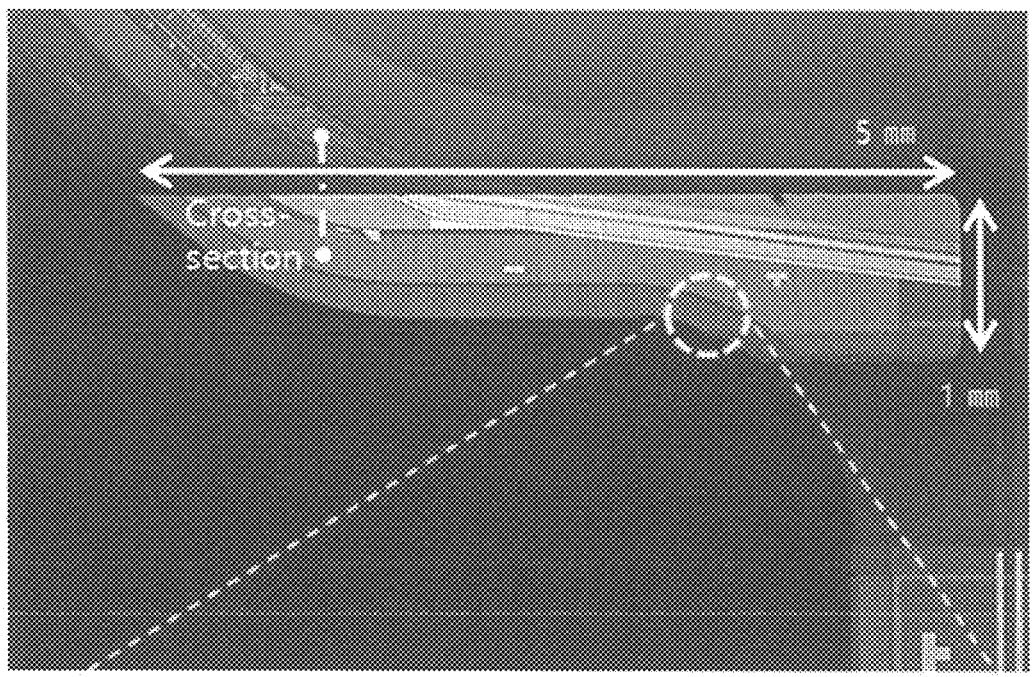
FIG. 10 shows a photograph of an unbiased highly accelerated stress test (UHAST) result of a display panel according to an embodiment.
Figure 10:
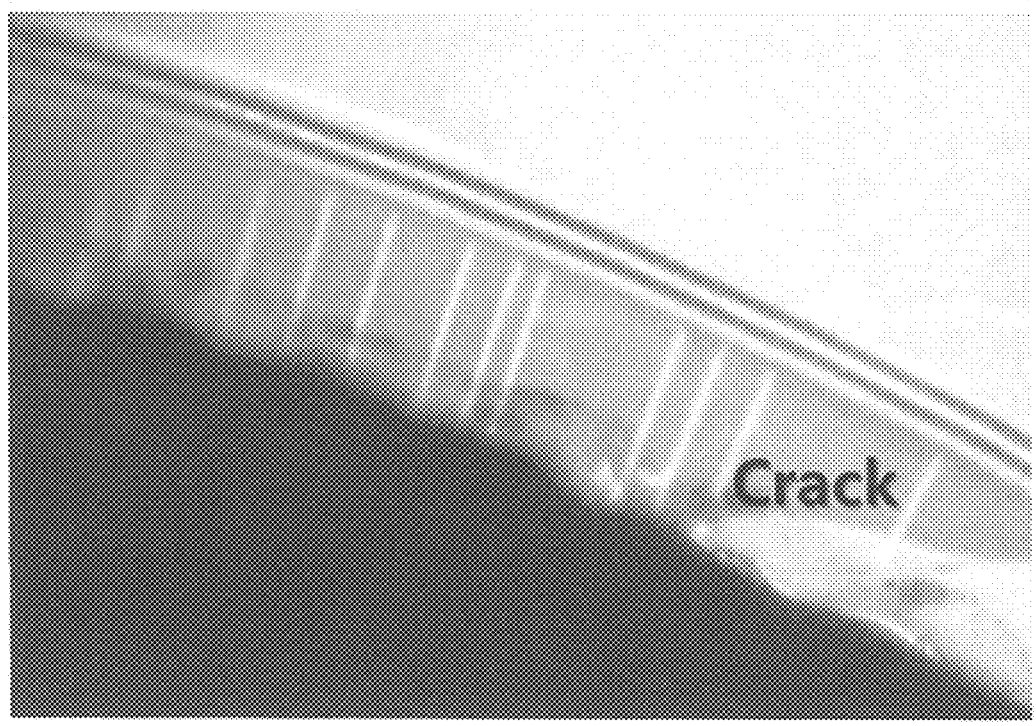

FIG. 9 shows a photograph of an unbiased highly accelerated stress test (UHAST) result of a display panel according to a comparative example, and FIG. 10 shows a photograph of an UHAST result of a display panel according to an embodiment.

FIG. 9 shows a photograph of a display panel in which a protection film does not include a cavity and which may be positioned or disposed in the substantially L-shaped region after it is exposed for about 240 hours in the high temperature/high humidity (85° C./85%) condition. It is found that the crack generated at the edge of the substantially L-shaped region is spread into the substantially L-shaped region.

FIG. 10 shows a photograph of a display panel in which a protection film includes a cavity in the substantially L-shaped region after it is exposed for about 240 hours in the high temperature/high humidity (85° C./85%) condition. A relatively bright portion corresponds to the cavity in which no protection film may be positioned or disposed. The crack is found at the edge of the substantially L-shaped region, but is not spread to the substantially L-shaped region. From HUAST results on the display panel according to a comparative example (refer to FIG. 9) and the display panel according to an embodiment (refer to FIG. 10), it is observed that the cavity formed in the substantially L-shaped region on which the stress is focused or applied may prevent generation or spreading of cracks in the substantially L-shaped region.

Figure 11:
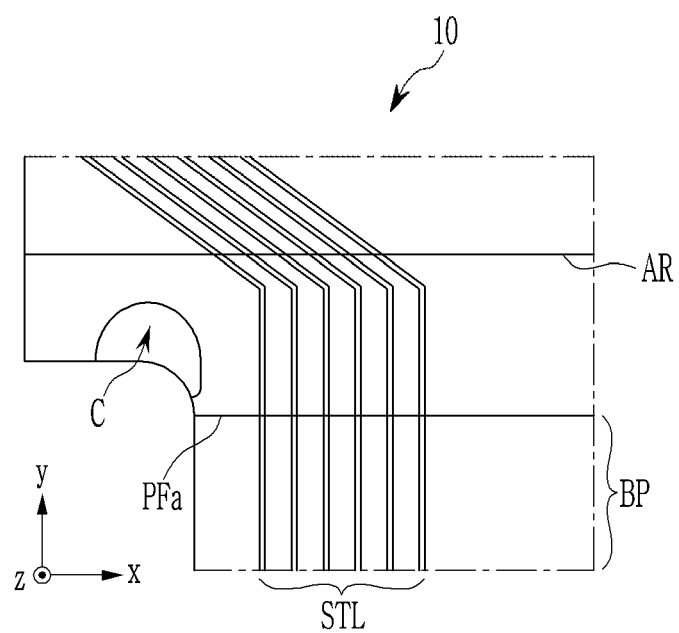
FIG. 11 shows a partial enlarged view of a display panel in a display device according to an embodiment.

FIG. 11 shows a partial enlarged view of a display panel in a display device according to an embodiment.

An embodiment described with reference to FIG. 11 may be different from an embodiment described with reference to FIG. 5 in the shape and the range of the cavity (C). As shown, regarding the cavity (C), the edge defined by the protection film (PFa) may form a substantially curved line. However, the cavity (C) may have various shapes, and has no limits in a case that it may be positioned or disposed at the edge of the substantially L-shaped region. The cavity (C) may not be formed up to the region overlapping the antireflection layer (AR), which is because the region in which the antireflection layer (AR) may be positioned or disposed on the display panel 10 may be outside of the substantially L-shaped region on which the stress may be concentrated.

A display device in which the above-described display panel may be combined to a window and a cover panel will now be described with reference to FIG. 12 to FIG. 14.

Figure 12:
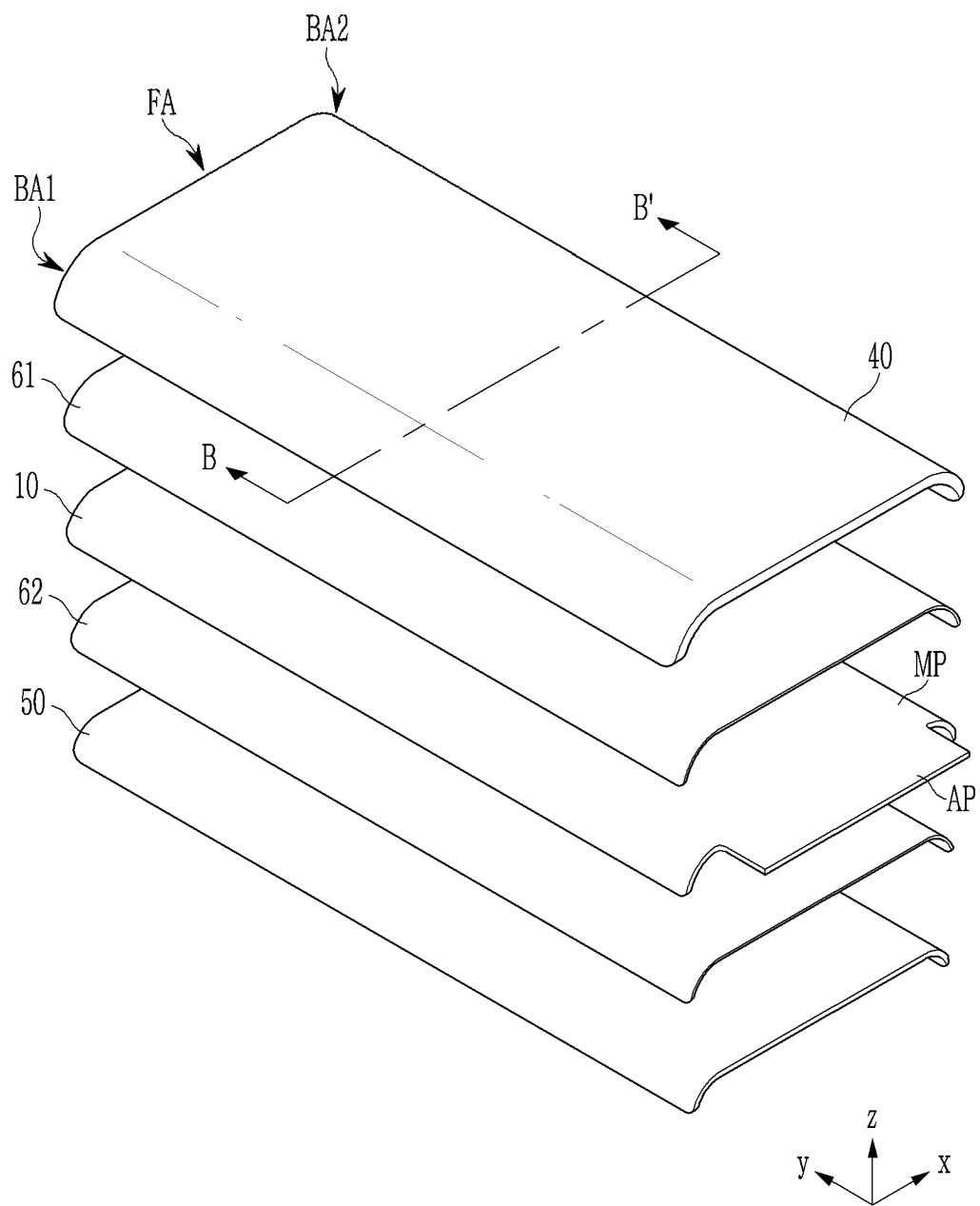
FIG. 12 shows an exploded perspective view of a display device according to an embodiment.
Figure 13:
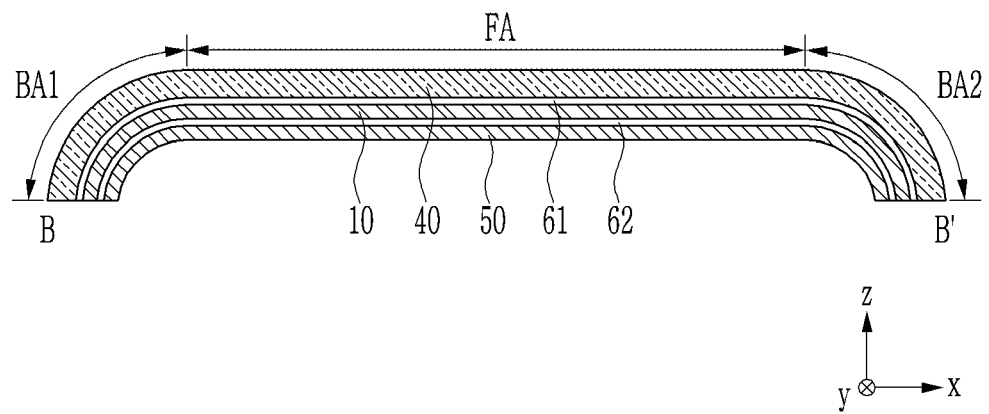
FIG. 13 shows a schematic cross-sectional view with respect to line B-B' of FIG. 12.
Figure 14:
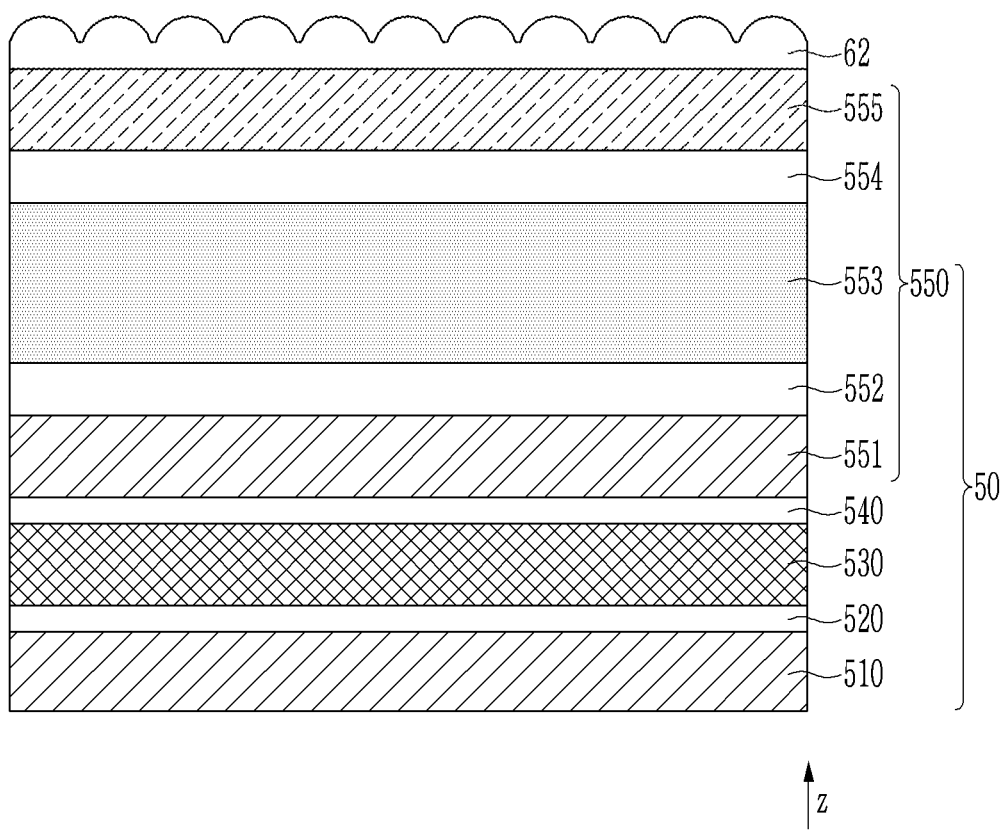
FIG. 14 shows a schematic cross-sectional view of a cover panel in a display device according to an embodiment.

FIG. 12 shows an exploded perspective view of a display device according to an embodiment, FIG. 13 shows a schematic cross-sectional view with respect to line B-B' of FIG. 12, and FIG. 14 shows a schematic cross-sectional view of a cover panel in a display device according to an embodiment.

Referring to FIG. 12 and FIG. 13, the display device may include a display panel 10, a window 40 positioned or disposed on a side of the display panel 10, and a cover panel 50 positioned or disposed on the rear side of the display panel 10. The display device may be an electronic device such as a smartphone, a mobile phone, a tablet, a multimedia player, or a portable information terminal, or a module used with such an electronic device. Regarding the display device, at least one of four edge areas may be bent. In an embodiment, regarding the display device, a pair of edge areas facing each other may be bent. In this bending case, a flat area (FA) that may be substantially flat, and bent areas BA1 and BA2 positioned or disposed or disposed on respective sides of the flat area, may be included. Regarding the display device, the display panel 10, the window 40, and the cover panel 50 may include a flat area and bent areas respectively corresponding to the flat area (FA) and the bent areas BA1 and BA2 of the display device. The above-described bendable regions BR1 and BR2 of the display panel correspond to the bent areas BA1 and BA2 of the display device.

Regarding the display device, the window 40, the display panel 10, and the cover panel 50 may be attached to each other. An adhesive such as an optically clear adhesive (OCA) may be used so as to attach the window 40 and the display panel 10, and an adhesive layer 61 made of such an adhesive may be positioned or disposed between the window 40 and the display panel 10. An adhesive layer 62 may be positioned or disposed between the display panel 10 and the cover panel 50 so as to attach the display panel 10 and the cover panel 50.

The window 40 may protect the display panel 10 from the external environment and impacts. The window 40 may function as a supporter for maintaining the bent state of the display panel 10. The window 40 may be made of a transparent and hard material such as glass or plastic so that an image displayed on the screen of the display panel 10 may be seen. Regarding the window 40, at least the region corresponding to the screen may be optically transparent. Regarding the window 40, a region corresponding to the non-display area in the main part (MP) of the display panel 10 may be coated with a light blocking material. The window 40 may be bent by thermoforming, for example, a glass plate or a plastic plate.

The main part (MP) of the display panel 10 may be attached to the window 40, and the auxiliary part (AP) of the display panel 10 may not be attached to the window 40. Most of the auxiliary part (AP) may be positioned or disposed on the rear side of the main part (MP) in a case that the bending portion (BP) may be bent. The flexible printed circuit film 20 bonded to the auxiliary part (AP) and the integrated circuit chip 30 mounted on the auxiliary part (AP) are not illustrated.

The cover panel 50 protects the display panel 10 from the environment (for example, impacts, electromagnetic waves, noise, and the like,) of the rear side of the display panel 10. The cover panel 50 may spread heat generated by the display panel 10, and may prevent heat generated by a processor, a battery, and a memory that may be positioned or disposed on the rear side of the display panel 10 in the electronic device from being transmitted to the display panel 10. The cover panel 50 may be referred to as a protecting sheet or a lower sheet.

FIG. 14 shows a cross-sectional configuration of a cover panel 50 that may be included in the above-described display device. Referring to FIG. 14, the cover panel 50 may have a configuration in which a plurality of layers may be stacked. The cover panel 50 may include a shield layer 510, a heat radiation layer 530, and an impact absorbing layer 550. Adhesive layers 520 and 540 for attaching layers may be positioned or disposed between the respective layers. The adhesive layer 62 for attachment with the display panel 10 may be positioned or disposed on an upper side of the cover panel 50.

The shield layer 510 may prevent electromagnetic waves, static electricity, and noise from being input toward the display panel 10 from the rear side of the cover panel 50. The shield layer 510 may also increase a heat radiation characteristic of the heat radiation layer 530. The shield layer 510 may be a metal layer including a metal with excellent heat conductivity together with shield performance such as copper or aluminum.

The heat radiation layer 530 may radiate the heat generated by a heating element such as a processor or a battery. The heat radiation layer 530 may include a material with excellent heat conductivity. The heat radiation layer 530 may include a carbon material such as graphite, graphene, or carbon nanotubes.

The impact absorbing layer 550 may include a first support layer 551, a cushion layer 553, and a second support layer 555. The first and second support layers 551 and 555 may be plastic layers made of a polymer such as polyimide or polyethylene terephthalate. The first and second support layers 551 and 555 may combine the cushion layer 553 positioned or disposed therebetween to another layer or member. The cushion layer 553 may absorb impacts to prevent the display panel 10 from being damaged. The cushion layer 553 may be a porous layer made of a material such as polyurethane or polyethylene. The cushion layer 553 may include a foam resin. The cushion layer 553 may include an elastomer. Between the first support layer 551 and the cushion layer 553, and between the cushion layer 553 and the second support layer 555, adhesive layers 552 and 554 for attaching them may be positioned or disposed.

Figure 15:
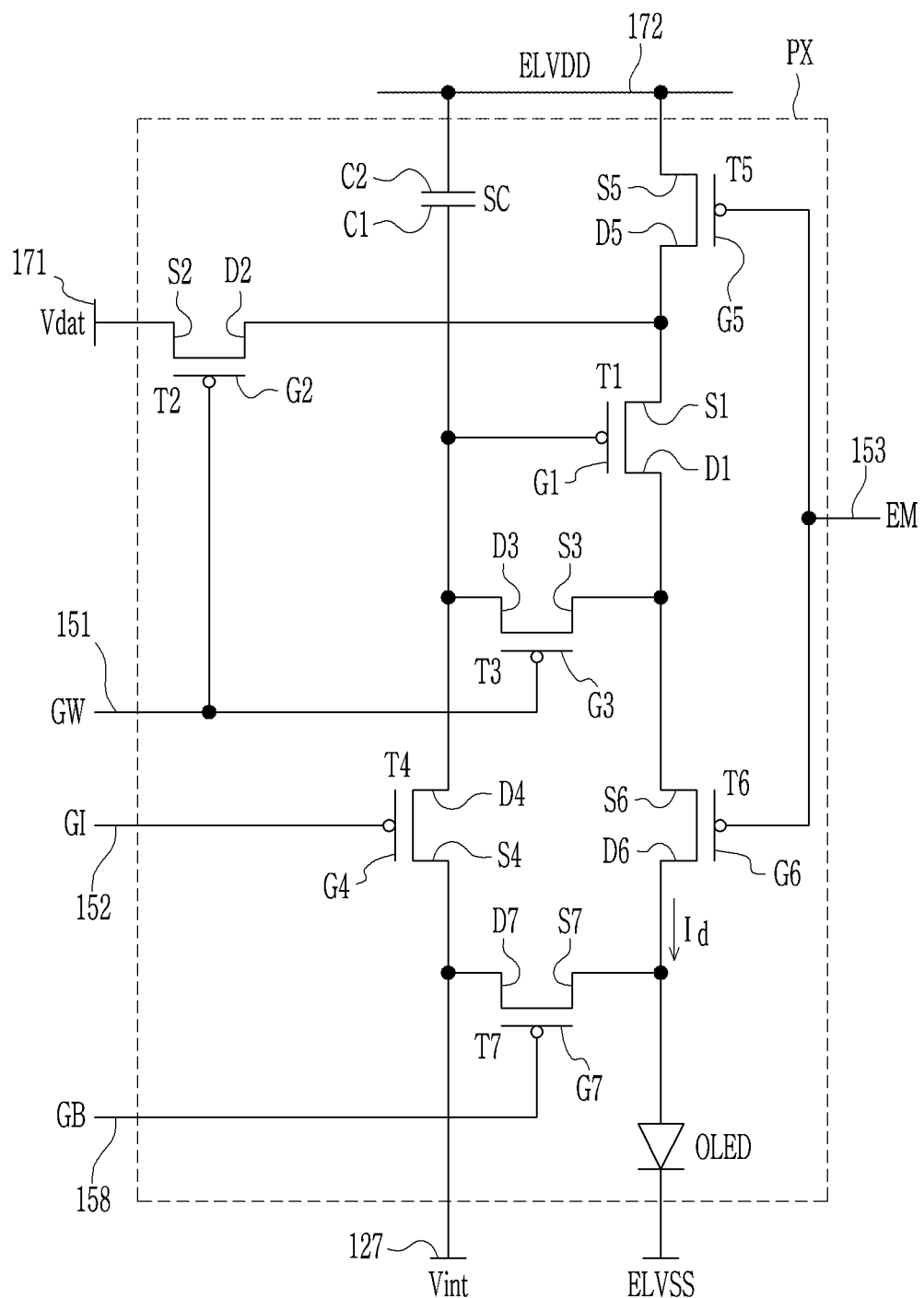
FIG. 15 shows an equivalent circuit diagram of one or a pixel of a display device according to an embodiment.

FIG. 15 shows an equivalent circuit diagram of one or a pixel of a display device according to an embodiment.

Referring to FIG. 15, the pixel PX may include transistors T1 to T7 electrically connected to signal lines 127, 151, 152, 153, 158, 171, and 172, a storage capacitor (SC), and a light emitting diode (LED).

The transistors T1 to T7 may include a driving transistor T1, a switching transistor T2, a compensation transistor T3, an initialization transistor T4, an operation control transistor T5, an emission control transistor T6, and a bypass transistor T7.

The signal lines 127, 151, 152, 153, 158, 171, and 172 may include an initializing voltage line 127, a scan line 151, a previous-stage scan line 152, an emission control line 153, a bypass control line 158, a data line 171, and a driving voltage line 172.

The scan line 151 may transmit a scan signal (GW) to the switching transistor T2 and the compensation transistor T3. The previous-stage scan line 152 may transmit a previous-stage scan signal (GI) to the initialization transistor T4. The emission control line 153 may transmit an emission control signal (EM) to the operation control transistor T5 and the emission control transistor T6. The bypass control line 158 may transmit a bypass signal (GB) to the bypass transistor T7. The bypass control line 158 may be electrically connected to the previous-stage scan line 152.

The data line 171 may receive a data voltage Vdat, and the driving voltage line 172 and the initializing voltage line 127 may receive a driving voltage (ELVDD) and an initializing voltage (Vint), respectively. The initializing voltage (Vint) may initialize the driving transistor T1.

Figure 16:
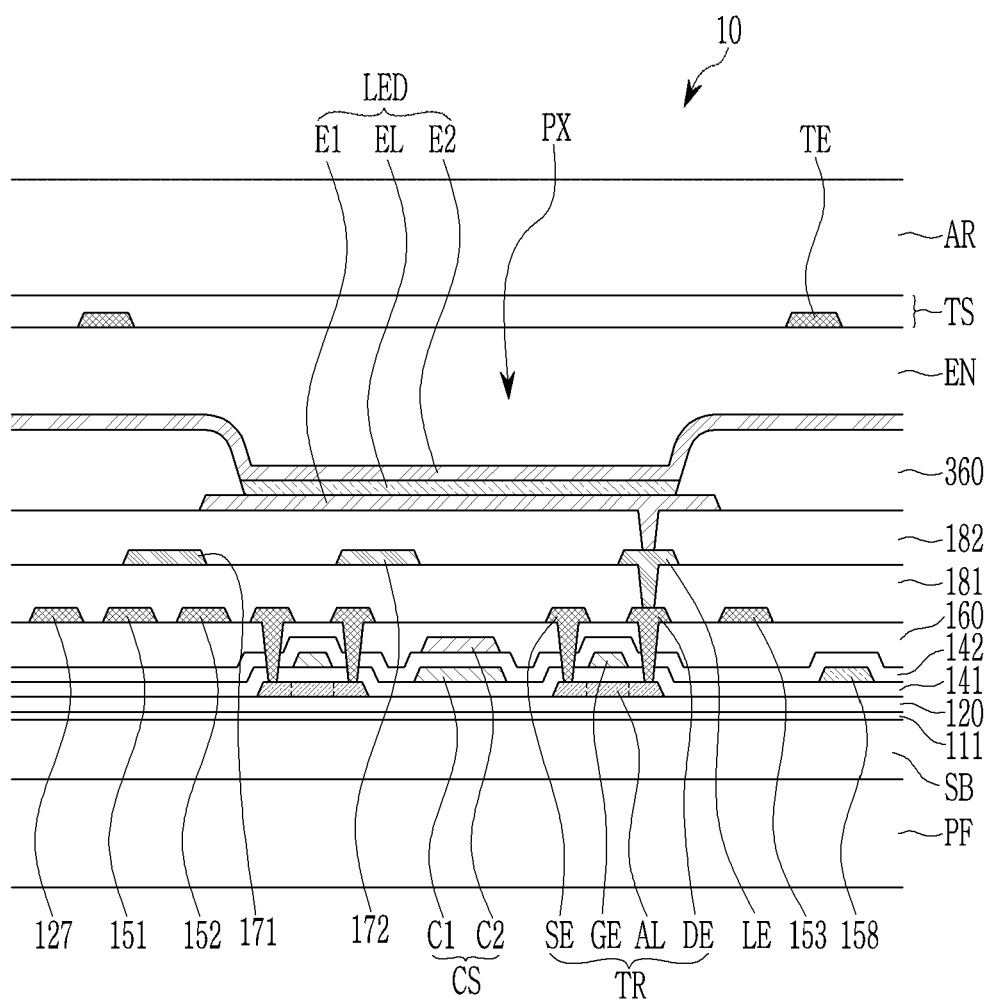
FIG. 16 shows a schematic cross-sectional view of one or a pixel area in a display panel according to an embodiment.

The respective transistors T1 to T7 may include gate electrodes G1 to G7, source electrodes S1 to S7, and drain electrodes D1 to D7, and the storage capacitor (SC) may include a first electrode C1 and a second electrode C2. The electrodes of the transistors T1 to T7 and the storage capacitor (SC) may be electrically connected as shown in FIG. 16. An anode of the light emitting diode (LED) that may be an organic light emitting diode (OLED) may be electrically connected to a drain electrode D1 of the driving transistor T1 through the emission control transistor T6, and may receive a driving current (Id). A cathode of the light emitting diode (LED) may receive a common voltage (ELVSS).

Regarding the circuit configuration of the pixels PX, a number of transistors and capacitors, and their connections, are modifiable in various ways.

A schematic cross-sectional view of a display panel according to an embodiment will now be described with reference to FIG. 16.

FIG. 16 shows a schematic cross-sectional view of one or a pixel area in a display panel according to an embodiment.

Referring to FIG. 16, the display panel 10 may have a configuration in which a plurality of layers, wires, and elements may be stacked on the substrate (SB) to form and drive the pixels PX.

A barrier layer 111 and a buffer layer 120 may be positioned or disposed on the flexible substrate (SB). A semiconductor layer (AL) of the transistor (TR) may be positioned or disposed on the buffer layer 120. The semiconductor layer (AL) may include a channel region, and a source region and a drain region positioned or disposed on respective sides of the channel region. The semiconductor layer (AL) may include polysilicon, amorphous silicon, or an oxide semiconductor. The buffer layer 120 may prevent impurities or moisture degrading characteristics of the semiconductor layer (AL) from spreading or permeating.

A first gate insulating layer 141 may be positioned or disposed on the semiconductor layer (AL). A first gate conductor including a gate electrode (GE) of the transistor (TR), the bypass control line 158, and the first electrode C1 of the storage capacitor (SC) may be positioned or disposed on the first gate insulating layer 141. The gate electrode (GE) may overlap the channel region of the semiconductor layer (AL). The first gate conductor may be made of the same or similar material in the same process.

A second gate insulating layer 142 may be positioned or disposed on the first gate conductor. A second gate conductor including the second electrode C2 of the storage capacitor (SC) may be positioned or disposed on the second gate insulating layer 142. The second gate conductor may be made of the same or similar material in the same process. An interlayer insulating layer 160 may be positioned or disposed on the second gate conductor.

The buffer layer 120, the first gate insulating layer 141, the second gate insulating layer 142, and the interlayer insulating layer 160 may include an inorganic insulating material such as a silicon oxide or a silicon nitride. The first gate conductive layer and the second gate conductive layer may include metals such as molybdenum (Mo), copper (Cu), aluminum (Al), silver (Ag), chromium (Cr), tantalum (Ta), or titanium (Ti).

A first data conductor including the source electrode SE and the drain electrode DE of the transistor (TR), the initializing voltage line 127, the scan line 151, the previous-stage scan line 152, and the emission control line 153 may be positioned or disposed on the interlayer insulating layer 160. The first data conductor may be made of the same or similar material in the same process. The source electrode SE and the drain electrode DE may be electrically connected to the source region and the drain region of the semiconductor layer (AL) through contact holes of the interlayer insulating layer 160. The gate electrode (GE), the source electrode SE, and the drain electrode DE may form the transistor (TR) together with the semiconductor layer (AL). The transistor (TR) may be a driving transistor or a transistor electrically connected to the driving transistor in the pixel PX of the emissive display device.

A first planarization layer 181 may be positioned or disposed on the first data conductor. A second data conductor including a data line 171, a driving voltage line 172, and a connection electrode (LE) may be positioned or disposed on the first planarization layer 181. The connection electrode (LE) may be electrically connected to the drain electrode DE of the transistor (TR) through a contact hole formed in the first planarization layer 181. The second data conductor may be made of the same or similar material in the same process. A second planarization layer 182 may be positioned or disposed on the second data conductor.

The first data conductor and the second data conductor may include metals such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta).

The first planarization layer 181 and the second planarization layer 182 may include an organic insulating material such as an acryl-based polymer, a siloxane-based polymer, and an imide-based polymer. The first planarization layer 181 and the second planarization layer 182 may remove steps and be planarized so as to increase emission efficiency of the light-emitting device to be positioned or disposed thereon. The first planarization layer 181 may include an inorganic insulating material.

A first electrode E1 of the light emitting diode (LED) may be positioned or disposed on the second planarization layer 182. The first electrode E1 may be electrically connected to the connection electrode (LE) through a contact hole formed in the second planarization layer 182. As the connection electrode (LE) is electrically connected to the drain electrode DE, the first electrode E1 may be electrically connected to the drain electrode DE through the connection electrode (LE). The first electrode E1 may be directly electrically connected to the drain electrode DE. The transistor (TR) to which the first electrode E1 may be electrically connected may be a driving transistor, or an emission control transistor electrically connected to the driving transistor. The first electrode E1 may be made of a reflective conductive material or a semi-reflective conductive material, or may be made of a transparent conductive material. The first electrode E1 may include a transparent conductive material such as an indium tin oxide (ITO) or an indium zinc oxide (IZO). The first electrode E1 may include a metal such as lithium (Li), calcium (Ca), aluminum (Al), silver (Ag), magnesium (Mg), and gold (Au).

A pixel defining layer 360 including an opening overlapping the first electrode E1 may be positioned or disposed on the second planarization layer 182. The pixel defining layer 360 may be referred to as a partition. The pixel defining layer 360 may include an organic insulating material such as an acryl-based polymer, an imide-based polymer, or an amide-based polymer.

An emission layer (EL) may be positioned or disposed on the first electrode E1. At least one of a hole injection layer, a hole transfer layer, an electron transfer layer, and an electron injection layer in addition to the emission layer (EL) may be positioned or disposed on the first electrode E1.

The second electrode E2 of the light emitting diode (LED) may be positioned or disposed on the emission layer (EL). The second electrode E2 may include a transparent conductive material such as an indium tin oxide (ITO) or an indium zinc oxide (IZO). The second electrode E2 may include a metal such as calcium (Ca), barium (Ba), magnesium (Mg), aluminum (Al), or silver (Ag). At least one protection layer or a function layer may be positioned or disposed on the second electrode E2.

The first electrode E1, the emission layer (EL), and the second electrode E2 may form a light emitting diode (LED) that may be an organic light emitting diode (OLED). The first electrode E1 may be an anode that may be a hole injection electrode, and the second electrode E2 may be a cathode that may be an electron injection electrode, and vice versa within the spirit and the scope of the disclosure. The first electrode E1 may be referred to as a pixel electrode, and the second electrode E2 may be referred to as a common electrode.

An encapsulation layer (EN) may be positioned or disposed on the second electrode E2. The encapsulation layer may seal the light emitting diode (LED) to prevent moisture or oxygen from permeating from the outside. The encapsulation layer (EN) may be a thin film encapsulation layer including at least one inorganic layer and at least one organic layer stacked on the second electrode E2. The encapsulation layer (EN) may be provided as a substrate.

A touch sensor layer (TS) including a touch electrode (TE) may be positioned or disposed on the encapsulation layer (EN). The touch sensor layer (TS) may be used to sense a contact and/or non-contact touch of a user. The touch electrode (TE) may be made of a metal mesh, a transparent conductive material, and a conductive polymer. The touch sensor layer (TS) may be positioned or disposed on the encapsulation layer (EN), or may be positioned or disposed on another substrate and may be attached to the encapsulation layer (EN).

An antireflection layer (AR) may be positioned or disposed on the touch sensor layer (TS). The antireflection layer (AR) may include a polarizer or a polarization layer. The antireflection layer (AR) may be attached to the touch sensor layer (TS) by an adhesive. The antireflection layer (AR) may be positioned or disposed on the touch sensor layer (TS).

A protection film (PF) may be positioned or disposed below the substrate (SB). The protection film (PF) may be formed by coating a UV curable resin on the rear side of the substrate (SB) and curing it. The protection film (PF) may be provided by attaching a film made of a polymer such as polyethylene terephthalate, polyethylene naphthalate, polyimide, or polyethylene sulfide to the substrate (SB) by an adhesive. As described above, the protection film (PF) may not be positioned or disposed on the bending portion (BP) of the display panel 10. The protection film (PF) may include a cavity in the substantially L-shaped region of the display panel 10.

While the disclosure has been described in connection with what is considered to be embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
   a substrate including:
      a first portion including a display area and having a first width; and
      a second portion extending from the first portion and having a second width narrower than the first width; and
   a protection film disposed on a rear side of the substrate,
      wherein the protection film includes a cavity at a border portion of the first portion and the second portion of the substrate.

2. The display device of claim 1, wherein an edge of the protection film and an edge of the substrate define the cavity.

3. The display device of claim 2, wherein
   the cavity is indented into the first portion of the substrate, the second portion of the substrate, or the first portion of the substrate and the second portion of the substrate from the edge of the substrate.

4. The display device of claim 2, wherein the edge of substrate defining the cavity includes a portion extending-in-a curved line.

5. The display device of claim 2, wherein the edge of the protection film defining the cavity includes a portion extending in a curved line.

6. The display device of claim 2, wherein the edge of the protection film is inclined with respect to the cavity.

7. The display device of claim 1, wherein
   the second portion of the substrate includes a bending portion, and
   the cavity is disposed between the display area and the bending portion.

8. The display device of claim 7, further comprising:
   an antireflection layer disposed on the first portion of the substrate,
   wherein the cavity is disposed between the antireflection layer and the bending portion of the second portion of the substrate.

9. The display device of claim 1, further comprising:
   a plurality of wires disposed on the second portion of the substrate,
   wherein the cavity is spaced apart from the plurality of wires and does not overlap the plurality of wires.

10. The display device of claim 1, wherein
    the first portion of the substrate includes two bendable regions disposed at respective sides of the substrate, and
    the second width of the second portion of the substrate is equal to or less than a distance between the two bendable regions of the first portion of substrate.

11. A display device comprising:
    a display panel including:
       a substrate;
       a protection film disposed on a side of the substrate;
       a main part including a display area; and
       an auxiliary part having a width less than a width of the main part,
    the auxiliary part includes an edge that is adjacent to the main part and forms a curved line, and
    the protection film includes a cavity indented from the edge of the auxiliary part.

12. The display device of claim 11, wherein an edge of the protection film and an edge of the display panel define the cavity.

13. The display device of claim 12, wherein the edge of the protection film defining the cavity includes a portion extending in a curved line.

14. The display device of claim 12, wherein the edge of the protection film is inclined with respect to the cavity.

15. The display device of claim 11, wherein
    the auxiliary part of the display panel includes a bending portion, and
    the cavity is disposed between the display area and the bending portion.

16. The display device of claim 15, wherein
    the display panel includes an antireflection layer disposed in the main part and on the substrate, and
    the cavity is disposed between the antireflection layer and the bending portion.

17. The display device of claim 11, wherein
    the display panel includes a plurality of wires disposed in the auxiliary part, and
    the cavity is spaced apart from the plurality of wires and does not overlap the plurality of wires.

18. A display device comprising:
    a cover panel;
    a protection film disposed on an upper side of the cover panel;
    a display panel disposed on an upper side of the protection film; and
    a window disposed on an upper side of the display panel,
    wherein the display panel includes:
       a first portion including a display area and having a first width; and
       a second portion extending from the first portion and having a second width narrower than the first width,
    the protection film includes a cavity at a border portion of the first portion and the second portion of the display panel, and
    the cavity is disposed at an edge of the protection film and an edge of the display panel.

19. The display device of claim 18, wherein
    the second portion of the display panel includes a bending portion, and
    the cavity is disposed between the display area and the bending portion.

20. The display device of claim 19, wherein the cover panel includes at least one of a shield layer, a heat radiation layer, and an impact absorbing layer.

* * * * *